US006865112B2

United States Patent
Kawai et al.

(10) Patent No.: US 6,865,112 B2
(45) Date of Patent: Mar. 8, 2005

(54) NON-VOLATILE SEMICONDUCTOR MEMORY DEVICE IN WHICH ONE PAGE IS SET FOR A PLURALITY OF MEMORY CELL ARRAYS

(75) Inventors: Koichi Kawai, Yokohama (JP); Kenichi Imamiya, Tokyo (JP); Hiroshi Nakamura, Fujisawa (JP); Koji Hosono, Yokohama (JP)

(73) Assignee: Kabushiki Kaisha Toshiba, Rokyo (JP)

( * ) Notice: Subject to any disclaimer, the term of this patent is extended or adjusted under 35 U.S.C. 154(b) by 0 days.

(21) Appl. No.: 10/795,881

(22) Filed: Mar. 8, 2004

(65) Prior Publication Data

US 2004/0170065 A1 Sep. 2, 2004

Related U.S. Application Data

(63) Continuation of application No. 10/190,069, filed on Jul. 3, 2002, now Pat. No. 6,717,858.

(30) Foreign Application Priority Data

Jul. 6, 2001 (JP) ........................................ 2001-206923

(51) Int. Cl.[7] ............................................. G11C 16/06
(52) U.S. Cl. ............................. 365/185.22; 365/185.12
(58) Field of Search ....................... 365/185.22, 185.12, 365/185.23, 185.14

(56) References Cited

U.S. PATENT DOCUMENTS

| | | | | |
|---|---|---|---|---|
| 5,748,535 A | * | 5/1998 | Lin et al. ................ | 365/185.22 |
| 5,768,190 A | | 6/1998 | Tanaka et al. ......... | 365/185.22 |
| 5,825,690 A | | 10/1998 | Saitoh .................... | 365/185.22 |
| 5,835,414 A | * | 11/1998 | Hung et al. ............ | 365/185.25 |
| 5,936,890 A | * | 8/1999 | Yeom ..................... | 365/185.22 |
| 5,995,417 A | * | 11/1999 | Chen et al. ............ | 365/185.29 |

\* cited by examiner

*Primary Examiner*—Anh Phung
(74) *Attorney, Agent, or Firm*—Frommer Lawrence & Haug LLP (57) ABSTRACT

A plurality of memory cell arrays are provided. Each of the memory cell arrays has a plurality of memory cells and the memory cells are connected to a plurality of word lines. Corresponding with the plurality of memory cell arrays, a plurality of word line drive circuits and a plurality of bit line control circuits are provided. Each of the word line drive circuits selects and drives the word lines of the corresponding memory cell array. Each of the bit control circuits carries out verifying reading for the data written in advance in the plurality of memory cells of the corresponding memory cell array, and controls a select and driving operation for the word lines of the corresponding word line drive circuit based on a result of the verifying reading.

10 Claims, 8 Drawing Sheets

NON-VOLATILE SEMICONDUCTOR MEMORY DEVICE IN WHICH ONE PAGE IS SET FOR A PLURALITY OF MEMORY CELL ARRAYS

CROSS-REFERENCE TO RELATED APPLICATIONS

This application is a continuation of U.S. patent application Ser. No. 10/190,069, filed Jul. 3, 2002, now U.S. Pat. No. 6,717,858, issued on Apr. 17, 2004, the entire contents of which are incorporated herein by reference.

This application is based upon and claims the benefit of priority from the prior Japanese Patent Application No. 2001-206923, filed Jul. 6, 2001, the entire contents of which are incorporated herein by reference.

BACKGROUND OF THE INVENTION

1. Field of the Invention

The present invention relates to a non-volatile semiconductor memory device having a plurality of memory cell arrays and in which writing of data is carried in parallel by the plurality of memory cells.

2. Description of the Related Art

NAND flash memory is known as one type of non-volatile memory. In the NAND flash memory, non-volatile transistors are serially connected to form a NAND cell. Memory data of a plurality of non-volatile transistors can be simultaneously erased electrically. Writing of the NAND flash memory data can be carried out on the selected memory cell by applying predetermined voltages, thus shifting the threshold voltage. At the time of the writing, the threshold voltage is not shifted all at once to the desired threshold value. The voltage to be applied to the memory is gradually changed and one writing operation is carried out in a number of stages, and thus the threshold voltage can be changed by little by little. During the writing operation, data is read from the memory cell on which the writing is carried out, and a verifying reading operation is carried out to determine whether or not the data which was read matches the write data. For the memory cells whose verification result was "pass", that is for the memory cell in which the writing was carried out such that the threshold voltage was within a predetermined range, the writing operation is finished. For the memory cells whose verification result was "fail", that is, for those memory cells whose threshold voltage were not shifted sufficiently so as to be within the predetermined range, the voltage condition are changed and writing is carried out again.

It is to be noted that hereinafter, memory data for the memory cell in which the data is in the erased state or in which the threshold voltage is the original low value is considered "1", while the memory data for the memory cell for which writing has been carried out and the threshold voltage had been converted to a high value is "0".

The NAND flash memory is provided with a verification detecting circuit for determining whether or not the data has been correctly written in the memory cell.

Figure 1:
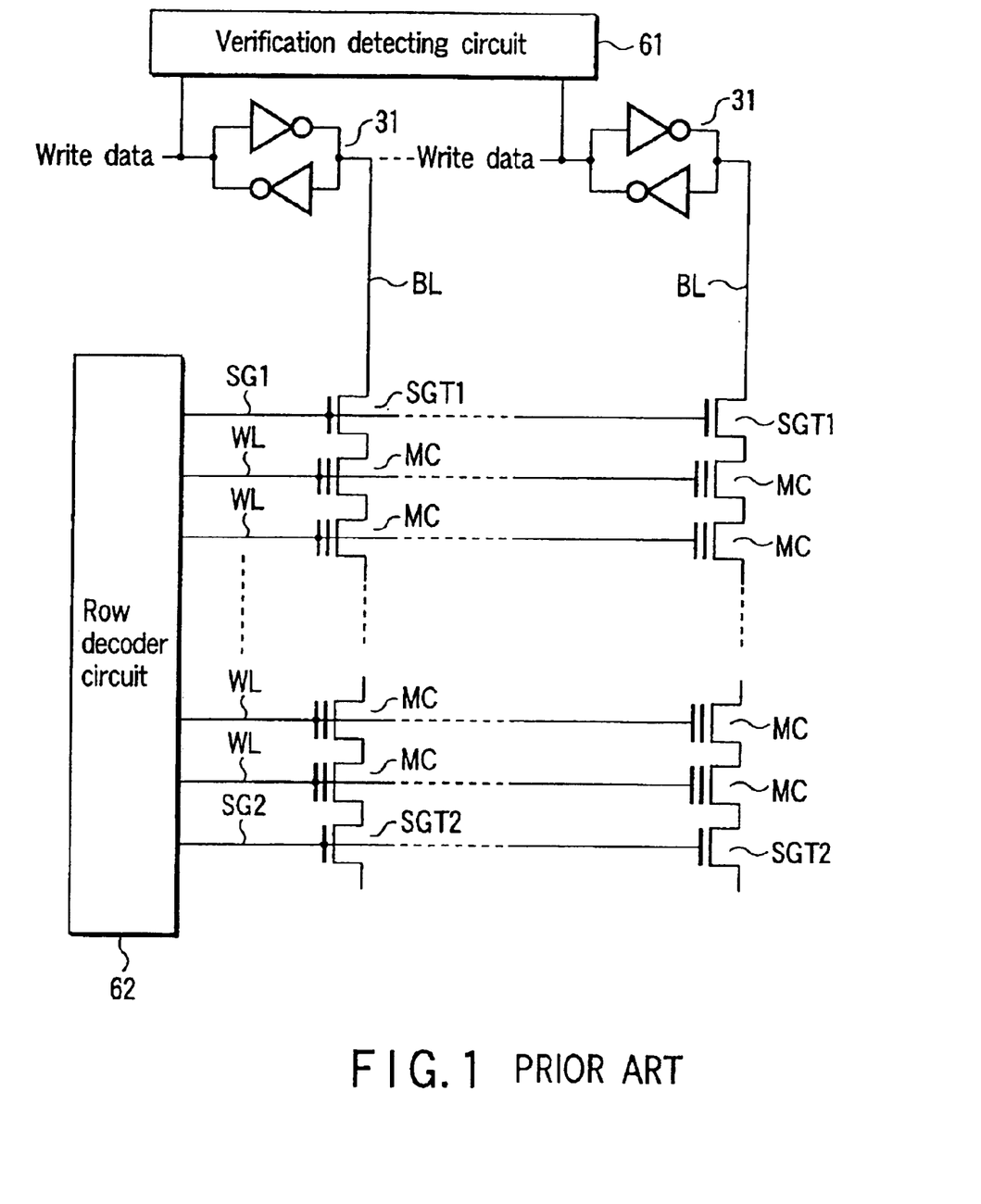
FIG. 1 is a circuit diagram showing the structure of the main portions of a conventional NAND flash memory.

FIG. 1 shows the main portions of a circuit structure of the NAND flash memory of the prior art in which a verification detecting circuit is provided.

A plurality of memory cells MC which includes the non-volatile transistors are provided in the NAND cell. Each of the non-volatile transistors has a control gate and a floating gate. Source-drain paths of the plurality of memory cells MC are serially connected. Also, a first select transistor SGT1 for selecting a NAND cell is connected to one end side of each NAND cell, and connected to the other end side is a second select transistor SGT2 for selecting the NAND cell. The control gates of the memory cells MC which form each of the NAND cells are provided so as to be common to those word lines which are provided so as to extend along a plurality of NAND cells. In addition, a select gate of the first select transistor SGT1 and a select gate of the second select transistor SGT2 are connected so as to be shared by the first select transistor SGT1 and the second select transistor SGT2 which are provided to extend along the plurality of NAND cells.

Also, each of the first select transistors SGT1 is connected to each of the latch circuits 31 via each of the bit lines BL. Each of the latch circuits 31 latches write data at a time of data writing, and at a time of the verifying reading, the latch circuit latches read data to be read to each of the bit lines BL from the memory cell. Each of the latch circuits 31 is connected to the verification detecting circuit 61.

A row decoder circuit 62 is connected to a plurality of word lines WL, a first select gate line SG1 and a second select gate line SG2. When data is read, written or erased, the word lines WL, the first select gate line SG1, and the second select gate line SG2 respectively are supplied with a predetermined voltage.

Figure 2:
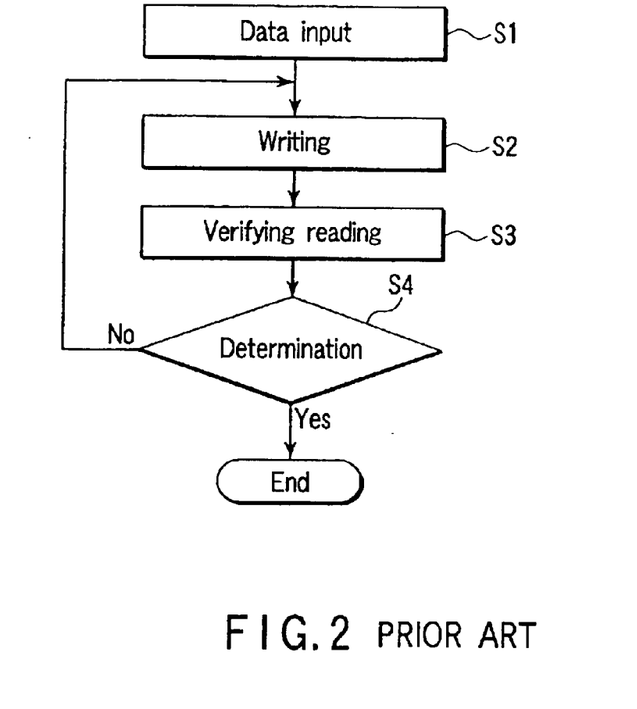
FIG. 2 is a flow chart showing the writing operation of the NAND flash memory of FIG. 1.

The writing operation of the memory shown in FIG. 1 is illustrated in the flowchart of FIG. 2. Firstly, write data is input to each of the latch circuits 31 and latched (S1). Subsequently, writing is carried out (S2). The writing is carried out as described in the following. Firstly, a bit line BL connected to the latch circuit latching the "1" level writing data charges voltage corresponding to "1" data. The bit line BL connected to the latch circuit 31 latching the "0" level writing data is caused to be 0 V. Subsequently, voltages which cause the first and second select transistors SGT1 and SGT2 to be in a on state are output from the row decoder circuit 62 to the first and second select gate lines SG1 and SG2. Further, a high voltage Vpgm is output from the row decoder circuit 62 to the selected word line connected to the memory cell in which the writing is carried out, and a high voltage Vpass which is lower than the high voltage Vpgm (Vpgm>Vpass) is output for all the remaining unselected word lines connected to memory cells in which writing is not carried out.

As a result, the voltage of the bit line BL which corresponds "1" data is transmitted to the drain of the memory cell in which writing is carried out and data writing is carried out on this memory cell.

After the data is written, the memory cell on which data writing was carried out is selected and data is read. The verifying reading is carried out by latching the data at the corresponding latch circuit 31 (S3). The data latched at each latch circuit 31 is sent to the verification detecting circuit 61. Here a comparison with the written data is carried out to thereby determine whether or not the writing was correctly carried out (S4). In the case where the data was not correctly written, the writing operation and the verifying operation are carried out once again. By repeatedly carrying out these operations, the data is eventually written correctly.

It is to be noted that in NAND flash memory, in order to increase the writing speed substantially, a system is used in which a large amount of data is written all at once. That is to say, the data writing is carried out in parallel at a plurality of memory cells connected to one word line. Accordingly, the unit for executing writing is a word line unit, and the writing unit is referred to as "page".

When the unit of memory which must be written at one time increases because of increases in the amount and speed of memory, one page uses a plurality of memory cell arrays in a flash memory. When one page spreads across a plurality of memory cell arrays in this manner, at the time data writing is executed, high voltage Vpgm and Vpass are simultaneously supplied to the selected word lines and the unselected word lines of all of the memory cell arrays in one page. Accordingly, if there is even one memory cell in a page for which writing is not complete, high voltage continues to be applied to the control gates of memory cells in the memory cell arrays for which writing has already been complete. When writing continues to be carried out despite the fact that the writing has been completed, the threshold voltage is not within the predetermined voltage distribution and writing is erroneous. The time for writing to be completed differs for different memory cell arrays because writing conditions vary due to variations in the structure of the memory cells.

In order to prevent this erroneous writing, in the prior art, a measure is used in which the bit line connected to the memory cell for which writing is complete, is caused to float electrically.

Figure 3:
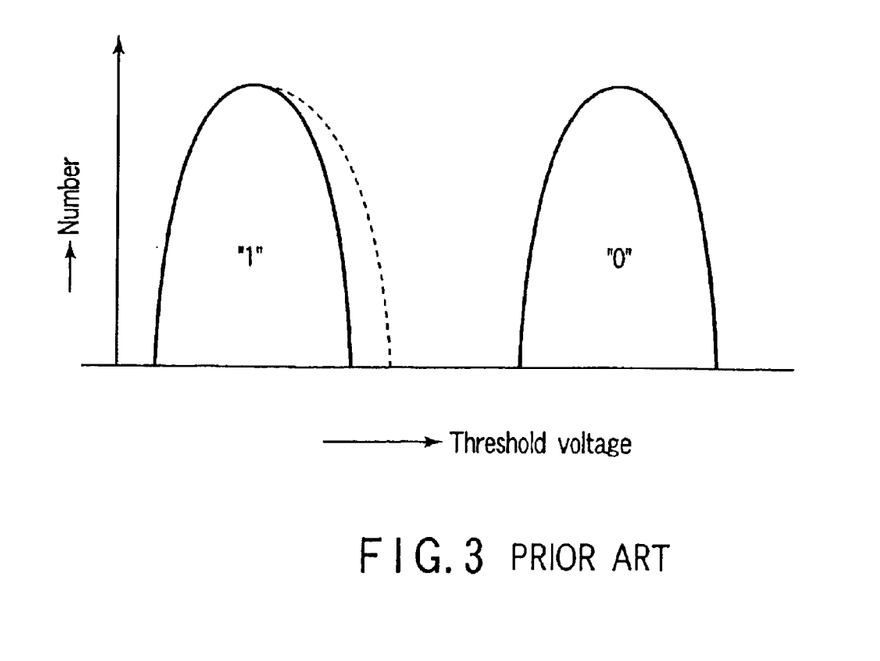
FIG. 3 shows the threshold voltage distribution of a memory cell of the NAND flash memory of FIG. 1.

However, even when the measure is used, the erased memory cell which has the data "1" in its memory has a small amount of writing, and as shown by broken lines in FIG. 3, a threshold voltage is not within the predetermined distribution range.

Accordingly, voltage unnecessary for the control gate of the memory cell must not be applied to memory cell arrays in which writing has been completed.

Further, the data to written may be less than one page, or there may at least one memory cell array in the plurality of memory cell arrays for which it is unnecessary to write data. In such cases, in the prior art, high voltage continues to be supplied to the control gate of the memory cell arrays which do not need to be written as well, until data writing is complete at all of the memory cell arrays. In these cases also, as described above, the erased memory cell which has the "1" data in its memory has a small amount of writing, and the threshold voltage is not within the predetermined distribution range.

In this manner, in the non-volatile memory of the prior art in which a unit of writing to be executed at once is executed by a plurality of memory cell arrays, voltage is supplied for word lines which are commonly provided to a plurality of memory cell arrays and writing of data is carried out. Thus due to variations in the structure of the memory cell, the conditions for writing differ, and after the writing, the threshold voltage is not with the desirable distribution range.

BRIEF SUMMARY OF THE INVENTION

According to a first aspect of the present invention, there is provided a non-volatile semiconductor memory device comprises: a plurality of memory cell arrays each having a plurality of memory cells, the plurality of memory cells being connected to a plurality of word lines; a plurality of word line drive circuits which are connected to the plurality of memory cell arrays, and which select and drive the plurality of word lines of the corresponding memory cell arrays; and a plurality of control circuits which are connected to the plurality of memory cell arrays, and execute verifying reading of data which has been written in the plurality of memory cells of the corresponding memory cell arrays, and control the select and drive operation for the word lines in the corresponding word line drive circuit in accordance with a result of the verifying reading.

According to a second aspect of the present invention, there is provided a non-volatile semiconductor memory device comprises: a plurality of memory cell arrays each having a plurality of memory cells, the plurality of memory cells being connected to a plurality of word lines; a plurality of word line drive circuits which are connected to the plurality of memory cell arrays, and which select and drive the plurality of word lines of the corresponding memory cell arrays; and a plurality of control circuits which are connected to the plurality of memory cell arrays, and which have a plurality of latch circuits which latch write data to be written to the plurality of memory cells of the corresponding memory cell arrays and execute verifying reading of data which has been written in the plurality of memory cells, thereby latching read data, and at the time of data writing, controls the select and drive operation for the word lines in the corresponding word line drive circuit in accordance with write data latched by the plurality of latch circuits, and at the time of verifying reading, controls the select and drive operation for the word lines in the corresponding word line drive circuit in accordance with verifying read data latched by the plurality of latch circuits.

DETAILED DESCRIPTION OF THE INVENTION

Figure 4:
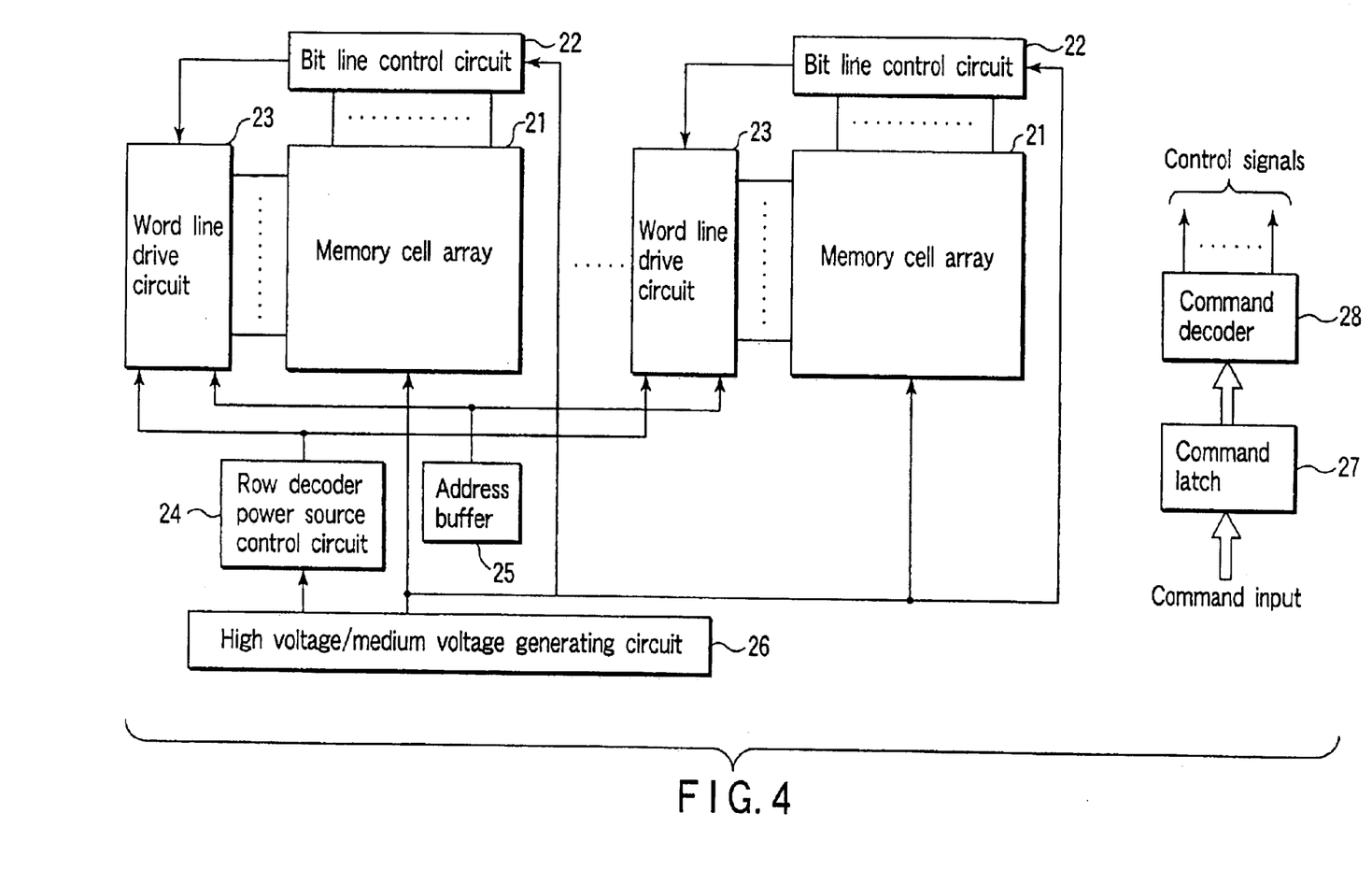
FIG. 4 is a block diagram showing the structure of the main portions of a NAND flash memory according to a first embodiment of the present invention.

FIG. 4 shows the main portion of the circuit structure of a NAND flash memory according to a first embodiment of the present invention.

The flash memory is provided with a plurality of memory cell arrays 21. Each memory cell array 21 includes a plurality of word lines, select gate lines, and bit lines, respectively. Corresponding to the memory cell arrays 21, a plurality of bit line control circuits 22 and a plurality of word line drive circuits 23 respectively are provided.

The plurality of bit lines of each memory cell array 21 are connected to the corresponding bit line control circuit 22, and the plurality of word lines and select gate lines are connected to the corresponding word line drive circuit 23. Each of the word line drive circuits 23 has a row decoder circuit.

In addition, a row decoder power source control circuit 24, an address buffer 25, and a high voltage/medium voltage generating circuit 26 are commonly provided to all the memory cell arrays 21.

The row decoder power source control circuit 24 and the address buffer 25 are connected to each of the word line drive circuits 23. In addition, the high voltage/medium voltage generating circuit 26 is connected to the row decoder power source control circuit 24, each memory cell array 21 and each bit line control circuit 22.

The command latch 27 receives a command input. A command decoder 28 is connected to the command latch 27. The command decoder 28 decodes the command and outputs control signals. In addition, an operation of the bit line control circuits 22, the word line drive circuit 23, the row decoder power source control circuit 24, the address buffer 25 and the high voltage/medium voltage generating circuit 26 are controlled based on the control signals output from the command decoder 28.

Aside from the above mentioned circuits, a column decoder circuit, a well potential control circuit, a source line control circuit, a data input buffer and the like are provided. However these have been omitted in the drawings.

The bit line control circuits 22 controls a data reading operation, a writing operation, a rewriting operation, a writing verification operation, and an erasing operation based on the output signals from the column decoder circuit and the control signals output from the command decoder 28. Each bit line control circuit 22 is provided with a latch circuit which mainly includes a CMOS flip flop circuit, and carries out a write data latching operation for writing in the memory cell, a sensing operation for a bit line potential, a sensing operation for carrying out a verifying read after the writing, and further, a latching operation for rewriting data.

Each of the word line drive circuits 23 controls a voltage of the control gate and the select gate of the memory cell in the memory cell arrays 21. Also, the row decoder power source control circuit 24 controls a power source voltage of each of the word line drive circuits 23.

The high voltage/medium voltage generating circuit 26 generates a high voltage for erasure, a high voltage for writing and a medium voltage for reading and the like. During the erasing operation, the high voltage for erasure is supplied to a p-well or a p-type substrate from which each of the memory cell arrays 21 is formed. Also, the high voltage for writing is supplied to the word lines in each of the memory cell array 21 which are being written, via the row decoder power source control circuit 24 and the word line drive circuits 23. Further, the medium voltage for reading is supplied to each of the bit lines in the respective memory cell arrays 21 via each of the bit line control circuits 22.

Figure 5:
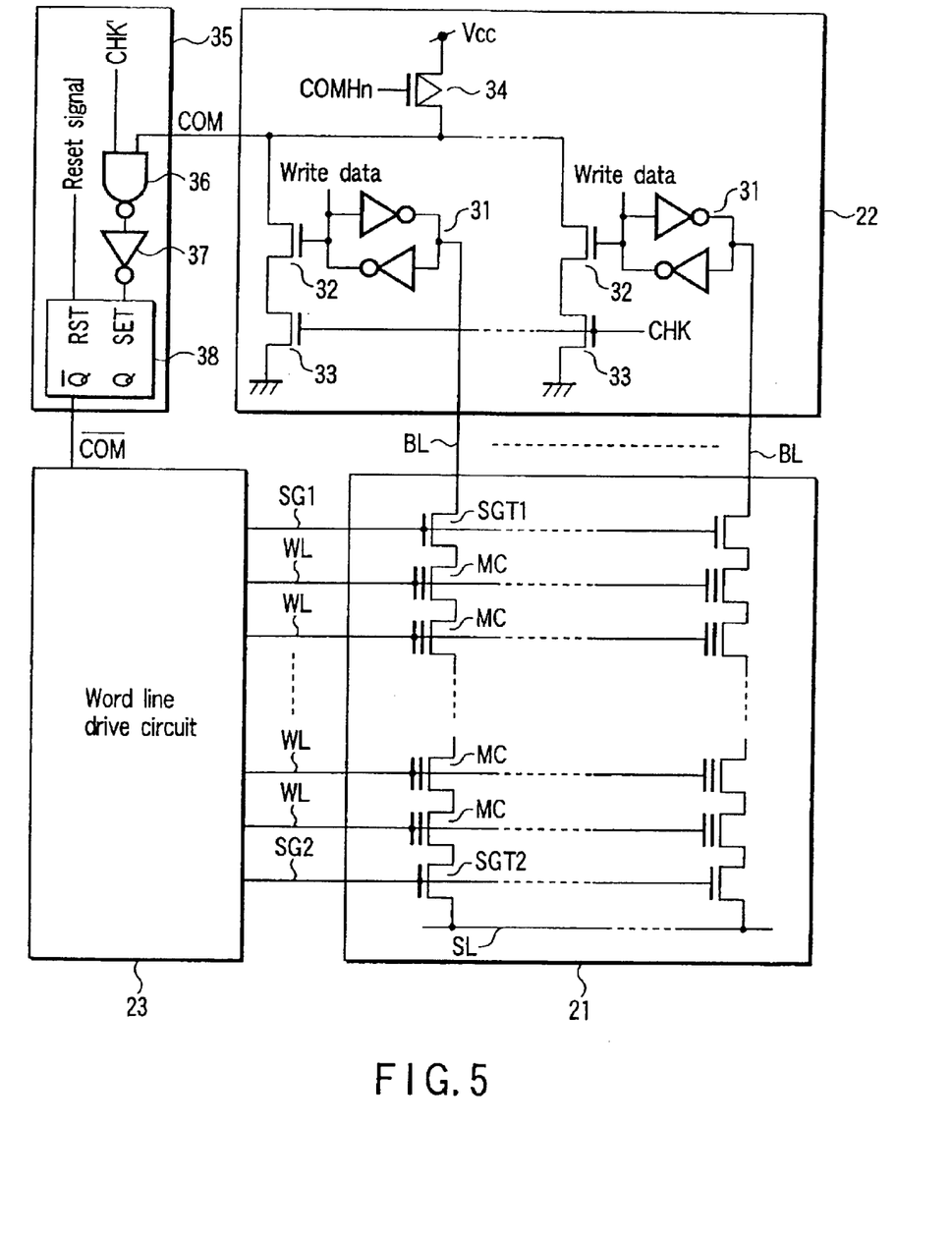
FIG. 5 is a circuit diagram showing the detailed structure of one memory cell array and bit line control circuit in the NAND flash memory of FIG. 4.

FIG. 5 shows a detailed example of the circuit structure of one of the memory cell arrays 21 of FIG. 4 and a bit line control circuit 22 which is connected thereto.

The memory cell array 21 is provided with a plurality of NAND cells. Each of the NAND cells is provided with a plurality of memory cells MC including non-volatile transistors which respectively have a control gate and a floating gate. Source-drain paths of the memory cells MC are connected in serial. One end of a first select transistor SGT1 and a second select transistor SGT2 for selecting a NAND cell are respectively connected to one end side and the other end side of the NAND cell. The other end of each of the first select transistors SGT1 is connected to the corresponding bit line BL. The other end of each of the second select transistors SGT2 are all connected to the source line SL.

The control gate of each of the memory cells MC is connected to a corresponding word line WL provided so as to extend along a plurality of NAND cells. In addition, a select gate of the first select transistor SGT1 and a select gate of the second select transistor SGT2 are connected to a first select gate line SG1 and a second select gate line SG2 provided so as to extend along a plurality of NAND cells, respectively.

The plurality of word lines WL are divided among each of the memory cell arrays 21. However, the unit for carrying out parallel writing, which is one page, is set so as to use a plurality of memory cell arrays. That is to say, when parallel writing or reading is carried out in the memory cells connected to one of the word lines WL in a memory cell array 21 in which reading is carried out, in the other memory cells 21 also, writing and reading is carried out at the same time in the memory cells which are connected to the word lines WL at the corresponding position.

A plurality of latch circuits 31 which are formed of CMOS flip flop circuits connected so as to correspond to each of the bit lines BL, are provided in each bit line control circuit 22. In each of the latch circuits 31, at the time of data writing, data which is to be written in the memory is latched, and at the time of the verifying reading data which is written in the memory is read and the data is latched. Further, in the bit line control circuit 22, a determination circuit is provided so that when data writing and verifying reading is carried out, a determination is made as to whether or not the all the data latched at the latch circuits 31 are at the same logic level. The determination circuit includes two N channel MOS transistors 32 and 33 respectively which are provided in each of the latch circuits 31, and one P channel MOS transistor 34 provided so as to be shared by the latch circuits 31.

Source-drain paths of the two N channel MOS transistors 32 and 33 are connected in a series between an output node of a determination signal COM and a node of a ground voltage. A gate of each transistor 32 is connected to the corresponding latch circuit 31. A gate of each transistor 33 is connected to a common control signal CHK node. Further, source-drain path of the P channel MOS transistor 34 is connected between a node of a power supply voltage Vcc and the output node of the determination signal COM. A gate of the transistor 34 is connected to a node of a control signal COMHn.

The determination signal COM is supplied to a verification result storage circuit 35 and stored therein. The verification result storage circuit 35 may be provided in the bit line control circuit 22, or at an outer portion of the bit line control circuit 22 as shown in the drawing.

The verification result storage circuit 35 stores the determination signal COM at predetermined times. As shown in FIG. 5, the verification result storage circuit 35 is formed of a logic circuit including a NAND circuit 36 and an inverter circuit 37, and a set/reset type flip flop circuit 38. The determination signal COM, and the control signal CHK' which moves up to the "H" level shortly after the control signal CHK, are input to the NAND circuit 36. An output signal of the NAND circuit 36 is input to the inverter circuit 37. An output signal of the inverter circuit 37 is input to a set terminal (SET) of the flip flop circuit 38, and a reset signal is input to a reset terminal (RST) of the flip flop circuit 38. Also, a signal/COM is output from a/Q output terminal of the flip flop circuit 38.

Figure 6:
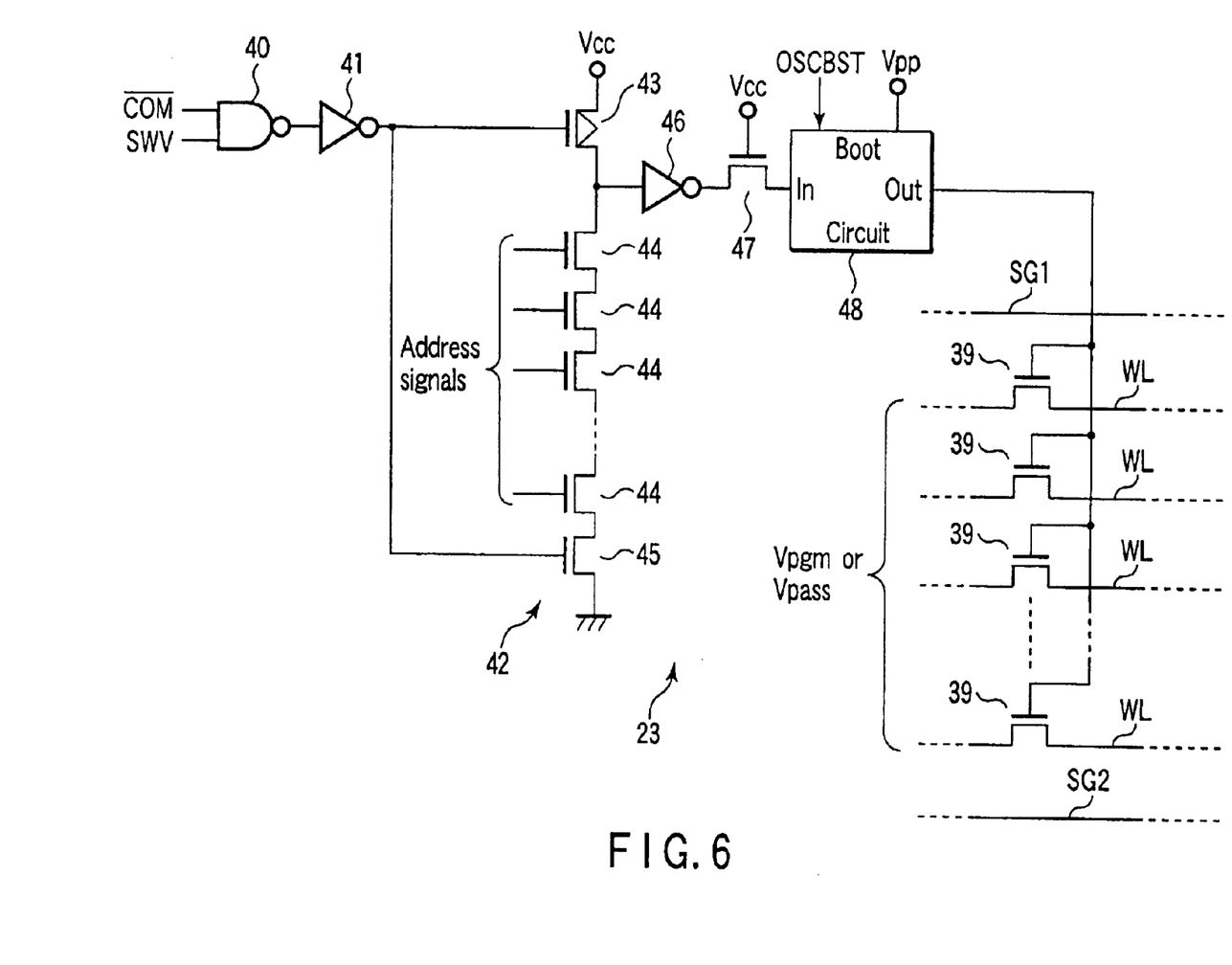
FIG. 6 is a circuit diagram showing the detailed structure of a word line drive circuit in the NAND flash memory of FIG. 4.

The word line drive circuits 23, drives and selects the word lines WL provided in the corresponding memory cell arrays 21 and the select gate lines SG1 and SG2 in accordance with row address signals output from the address buffer 25 in FIG. 4. In FIG. 6, the structure of the circuit portion which selectively drives the word lines WL in the word line drive circuit 23 is shown.

As shown in FIG. 6, a plurality of switch transistors 39 which are formed of N channel MOS transistors are provided in the word line drive circuit 23. Source-drain paths of the switch transistors 39 are connected between a plurality of nodes which supplies high voltages and the plurality of word lines WL. Examples of the high voltages to be supplied to the word lines include a high voltage Vpgm for application to the selected word line on which writing is carried out, or a high voltage Vpass for application to the unselected word lines on which writing is not carried out.

The signal/COM is input to one of the input terminals of the NAND circuit 40. A voltage application control signal SWV which controls whether or not the drive voltage is applied to the word lines WL in the corresponding memory cell array 21 from the word line drive circuits 23, is input to the other input terminal of the NAND circuit 40. An output signal of the NAND circuit 40 is input to the inverter circuit 41. An output signal of the inverter circuit 41 is input to a decoding circuit 42 along with address signals. The decode circuit 42 includes a pre-charging transistor 43 which is formed of a P-channel MOS transistor; decoding transistors 44 which are formed of N-channel MOS transistors. Each of the address signals input to the gate of the decoding transistors 44, respectively. The decode circuit 42 includes a discharge transistor 45 which is formed of an N-channel MOS transistor. Source-drain paths of the transistors 43, 44 and 45 are connected between a node of the power supply voltage Vcc and the ground voltage node. The output signal of the inverter circuit 41 is input to the gates of the transistors 43 and 45, respectively.

An output signal from the decoding circuit 42 is input to a boot circuit 48 via an inverter circuit 46 and a source-drain path of a separating transistor 47 which is formed of an N channel MOS transistor. The boot circuit 48 shifts the level of the Vcc type signal output from the inverter circuit 46 to a high voltage Vpp type signal. The signal which level has been shifted is input in parallel to the gates of the switch transistors 39.

Figure 7:
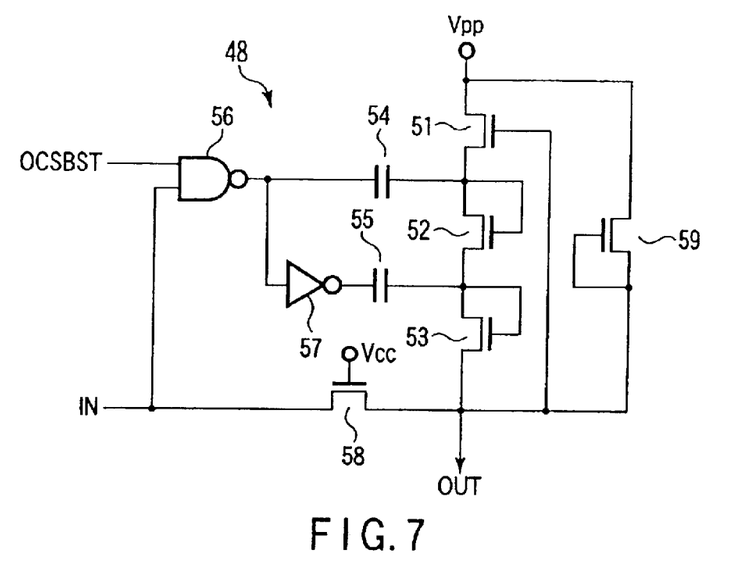
FIG. 7 is a circuit diagram showing the detailed structure of a boot circuit in FIG. 6.

FIG. 7 shows a detailed example of the circuit structure of the boot circuit 48 in FIG. 6.

Source-drain paths of the N-channel MOS transistors 51, 52 and 53 are connected in a series between a node of the high voltage Vpp and an output node OUT. Each of the gates of the transistors 51, 52 and 53 is connected to the drains thereof, respectively. One end of capacitors 54 and 55 is connected to a serial connection node of the transistors 51 and 52 and to a serial connection node of the transistors 52 and 53, respectively. An output signal of a NAND circuit 56 which is supplied with a signal of the input node IN signal and an oscillating signal OSCB having a predetermined frequency, is input to the other end of the capacitor 54. An output signal from an inverter circuit 57 for inverting the signal output from the NAND circuit 56 is input to the other end of the capacitor 55. In addition, source-drain path of an initial charging transistor 58 which is formed of an N-channel MOS transistor is connected between the input node IN and the output node OUT. Further, source-drain path of a voltage limiter transistor 59 which is formed of an N channel MOS transistor is connected between the node of the high voltage Vpp and the output node OUT.

Figure 8:
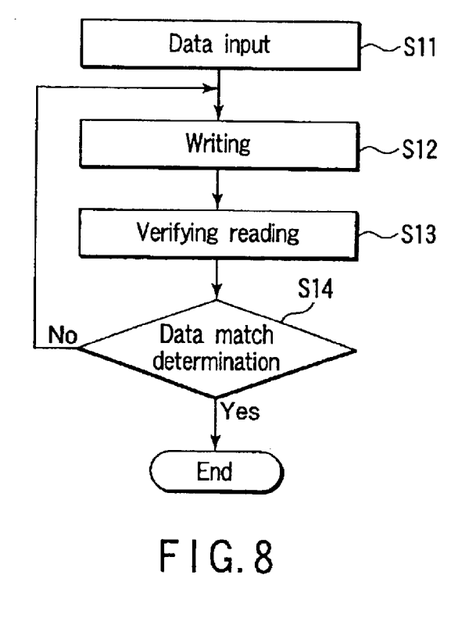
FIG. 8 is a flow chart of the data writing operation of the NAND flash memory of FIG. 4.

Next the data writing operation and the reading operation for verification of the flash memory having the above structure will be described with reference to FIG. 8. It is to be noted that data writing is carried out along the memory cells 21 shown in FIG. 4, and is carried out in parallel for the memory cells which are connected to each corresponding word line WL.

The data writing operation begins when the data writing command is input. After the data writing command is latched by the command latch 27, it is sent to the command decoder 28, and at the command decoder 28, control signals for controlling the writing operation are generated.

Firstly, write data is sent to each of the latch circuits 31 in the bit line control circuit 22 and then latched, and then data input is carried out (S11). Next writing is carried out (S12). The writing is carried out in the following manner. First, the bit line BL connected to the latch circuit 31 which latched the "1" level write data is supplied with a voltage which corresponds to "1" data. On the other hand, the bit line BL connected to the latch circuit 31 which latched the "0" level write data is supplied with a voltage of 0 V.

In addition, the determination signal COM output from the bit line control circuit 22 is set in advance to the "H" level before the data writing is carried out. By setting the control signal COMHn to the "L" level, and by putting the P channel MOS transistor 34 in the on state, the determination signal COM attains the "H" level. Further, prior to the data writing, the flip flop circuit 38 in the verification results storage circuit 35 is reset by the reset signal in advance. Accordingly, the signal/COM is set to "H" level. Also, at the time of data writing, the voltage control signal SWV is set to "H" level. Thus, at the time of data writing, the output signal from the NAND circuit 40 in FIG. 6 is at the "L" level and the output signal from the inverter circuit 41 is at the "H" level.

On the other hand, prior to the writing operation, the precharging transistor 43 is set to be in the on state, and the output signal from the decoding circuit 42 is set to the "H" level. In addition, when the writing operation begins and the output signal from the NAND circuit 40 is at the "L" level and the output signal from the inverter circuit 41 is at the "H" level, and the precharging transistor 43 is turned off, the discharging transistor 45 is turned on. At this time, each logic level of the address signals which are input to the gates of the MOS transistors 44 are at a level corresponding to the selected state. Specifically, if all of the address signals are at the "H" level, all of the MOS transistors 44 are on. The output signal from the decoding circuit 42 then falls to the "L" level. Conversely, the output signal from the inverter circuit 46, rises to the "H" level.

When the output signal from the inverter circuit 46 is at the "H" level, in the boot circuit 48 shown in FIG. 7, the output node OUT begins to supply the Vcc voltage which corresponds to the "H" level via the transistor 58.

Further, when the NAND circuit 56 is opened, signals which are inverse to each other are applied sequentially to each terminal of the capacitors 54 and 55 in accordance with the oscillating signal OSCBST. As a result, the voltage of the output node OUT is sequentially increased. Thus a high voltage which is higher than the Vpp is attained at the output node OUT. It is to be noted that if the high voltage exceeds a certain level, the volt limiting transistor 59 turns on and it limits the voltage of the output node OUT so that it does not exceed a predetermined level. That is to say, in the boot circuit 48, the Vcc type signal is shifted to the level of a signal having a higher voltage.

In addition, when the signal which level has been shifted at the boot circuit 48 is input to the gates of the switching transistors 39 in parallel, all of the transistors 39 turn on.

Data writing is carried out sequentially in the each of the NAND cells. It may, for example, be carried out in order from the memory cell which is in the position furthest from the bit line BL. That is to say, of the switch transistors 39, high voltage Vpgm (for example about 18 V) is supplied to that switch transistor at the lowest position in the figures, and a voltage Vpass which is lower than the high voltage Vpgm (Vpgm>Vpass) is supplied to each of the other switch transistors 39. The high voltages are supplied by the high voltage/medium voltage generating circuit 26 shown in FIG. 4. Since all of the switch transistors 39 are on at the time of writing, the high voltages Vpgm or the Vpass are output to the word lines WL. At this time, a voltage is output which causes the select transistor SGT1 in the memory cell array to turn on for the select gate line SG1 from the word line drive circuit 23.

As a result, the voltage of each of the bit lines BL is transmitted to the drain of the memory cell in which writing is carried out.

After data writing, the memory cell in which writing was carried out is selected and the data is read to each of the bit lines BL. Data is latched in the latch circuit 31 connected to each of the bit lines 31, and the verifying reading is carried out (S13). Here if "0" data is written correctly, at the latch circuit 31 in which data is read from the memory cell which threshold voltage is within the desired distribution range, the latch circuit 31 latches data "H" at the bit line BL side. On the other hand, when the "0" data is erroneously written, at the latch circuit 31 in which data is read from the memory cell which threshold voltage is not within the desired distribution range, the latch circuit 31 latches data "L" at the bit line BL side.

After the read data is latched at each of the latch circuits 31, in each bit line control circuit 22, the respective control signals COMHn is at the "L" level, and the control signal CHK is set to the "H" level and a determination is made as to whether the read data is the same as the white data (S14). When the control signal CHK is at the "H" level, each of the N channel transistors 33 in the determination circuit turns on. Also, the output from the latch circuit 31 which latches the data read from the memory cell in which the "0" data is correctly written causes the N channel transistor 32 which supplies the gate to be turned off. On the other hand, the output from the latch circuit 31 which latches the data read from the memory cell in which the "0" data is erroneously written, causes the N channel transistor 32 which supplies the gate to be turned on. Thus, even if there is one memory cell in which the "0" data is erroneously written present in one memory cell array 21, the determination signal COM which is output from the determination circuit is not a consistent state. That is to say, it is the "L" level which corresponds to the fail state.

When the determination signal COM is at the "L" level, after the control signal CHK' moves up to the "H" level, the flip flop circuit 38 is not set and the signal/COM remains at the "H" level. Further, the output signal from the NAND circuit 40 also remains in the "L" level and the switch transistors 39 in the word line drive circuit 23 remain in the on state. In addition, after that, the value of the high voltage Vpgm is changed and thus the writing condition is changed. Writing is carried out once again and after that the verifying reading is carried out.

After the verifying reading, all of the latch circuits 31 latch data "H" at the bit line BL side, and subsequently the determination is carried out and all of the N channel transistors 32 in the determination circuit are in the off state. In this case, the determination signal COM is the consistent state. That is to say, it is set to the "H" level which corresponds to the pass state. Thus after the control signal CHK' moves up to the "H" level, the flip flop circuit 38 is set and the signal/COM is at the "L" level. The output signal from the NAND circuit 40 changes from the "L" level to the "H" level. In addition, all of the switch transistors 39 in the word line drive circuit 23 are in off state. As a result, the high voltage Vpgm or Vpass is no longer output to the word lines WL of the corresponding memory cell array 21 from the word line drive circuit 23. That is to say, the drive operation for selecting the word lines is stopped, and the writing operation is finished.

In this manner, at the time of data writing, the writing operation is started simultaneously in a plurality of memory cell arrays 21. Here the case in which writing of data from only one memory cell array is completed because of differences in the writing conditions caused by variations in the structure of the memory cell, is taken into consideration. In the memory cell array for which writing is complete, the select and drive operation for the word lines is caused to stop by the corresponding word line drive circuit 23. Thus subsequent writing operations are not carried out. Accordingly, the threshold voltage of the memory cell in the memory cell array for which writing is complete does not change even if writing continues in the other memory arrays.

On the other hand, in the memory cell arrays for which writing is not complete, the select and drive operation for the word lines is not caused to stop by the corresponding word line drive circuit 23, and the high voltage Vpgm or Vpass is output and thus subsequently, writing operations continue. In addition, the select and drive operation for the word lines is caused to stop in accordance with the order in which the writing in the memory cell arrays is completed. When writing in all of the memory cells arrays is completed, the writing operation is finished.

In this manner, in the flash memory of the embodiment, the data writing operation can start simultaneously in a plurality of memory cell arrays, and completion of the writing operation can be carried out in each of the individual memory cell arrays. As a result, if writing conditions are different due to variations in the structure of the memory cell arrays, the threshold voltage of the memory cell after the writing is within the desired distribution range.

A second embodiment of the present invention will be described in the following.

In the flash memory of the first embodiment, which was described above, a verifying reading is carried out after data writing, and a determination is made as to whether or not the data read for each and every one of the memory cell arrays matches, and a control is carried out such that a determination is made as to whether or not output of voltage to the world lines will be continued after that.

When the operation is carried out in this manner, "1" data is written on all the memory cells in the memory cell arrays of the same page. That is, the high voltage Vpgm or Vpass is output even to the word lines connected the memory cells for which it is not necessary to increase the threshold voltage thereof. As a result, there is the undesirable possibility that the distribution of the threshold voltage of the memory cell which stores the "0" data may widen.

Figure 9:
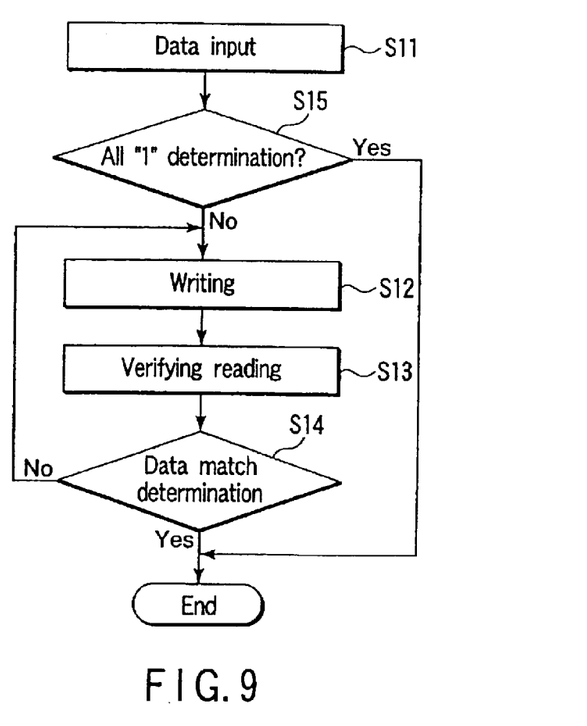
FIG. 9 is a flow chart of the data writing operation of a NAND flash memory according to a second embodiment of the present invention.

Thus, in the memory cell of the second embodiment, as shown in the flowchart in FIG. 9, after the write data are input in step S11, a step S15 is added in which, a determination is made as to whether or not all the write data which have been latched in the latch circuits 31 are "1". The determination operation is carried out using the determination circuit in the bit line control circuit 22 which is shown in FIG. 5

That is to say, after the write data is input to each of the latch circuits 31, in the bit line control circuit 22 corresponding to the memory cell array in which all the write data for the memory cells are "1", all the N channel transistors 32 in the determination circuit are in the off state. As a result, the control signal CHK is caused to be at the "H" level, and even if each of the N channel transistors 33 is in the on state, the determination signal COM maintains the "H" level. In this case, after the control signal CHK' is raised to the "H" level, the signal/COM is caused to be in the "L" level. As a result, the output signal of the NAND circuit 40 is caused to be in the "H" level and the high voltage Vpgm or Vpass is not output to the word lines of the corresponding memory cell array from the time the writing operation is initiated. That is to say, the writing operation of the memory cell array is not initiated.

On the other hand, when it is determined, in the determining circuit, that all the write data are not "1", then as shown in the flowchart in FIG. 9, the data writing operation (S12) and the verifying read operation (S13) is carried out, and subsequently the match determination of the verifying read data (S14) is carried out. In addition, as in the above-described case, after writing is completed in all of the memory cell arrays, the writing operation terminates.

In this flash memory of the second embodiment, after the write data are input to the latch circuits 31, a determination is made as to whether or not all the data latched in the latch circuits 31 are "1", and for the memory cells in which all the data are "1", high voltage is not output to the word lines after the start of the writing operation. As a result, expansion of the threshold voltage distribution range for the memory cells for which it is not necessary to increase the memory threshold voltage is prevented.

Further, after the determination as to whether or not all the write data are "1", as in the first embodiment, the data writing operation is carried out individually for each memory cell array, and thus even if there are different writing conditions due to variations in the structure of the memory cells, the threshold voltage of the memory cell after the writing is within the desired distribution range.

The third embodiment will be described in the following. As shown in FIG. 5, in the first and second embodiments, only one NAND cell, is connected to each of the bit lines BL in the memory cell array 21.

Figure 10:
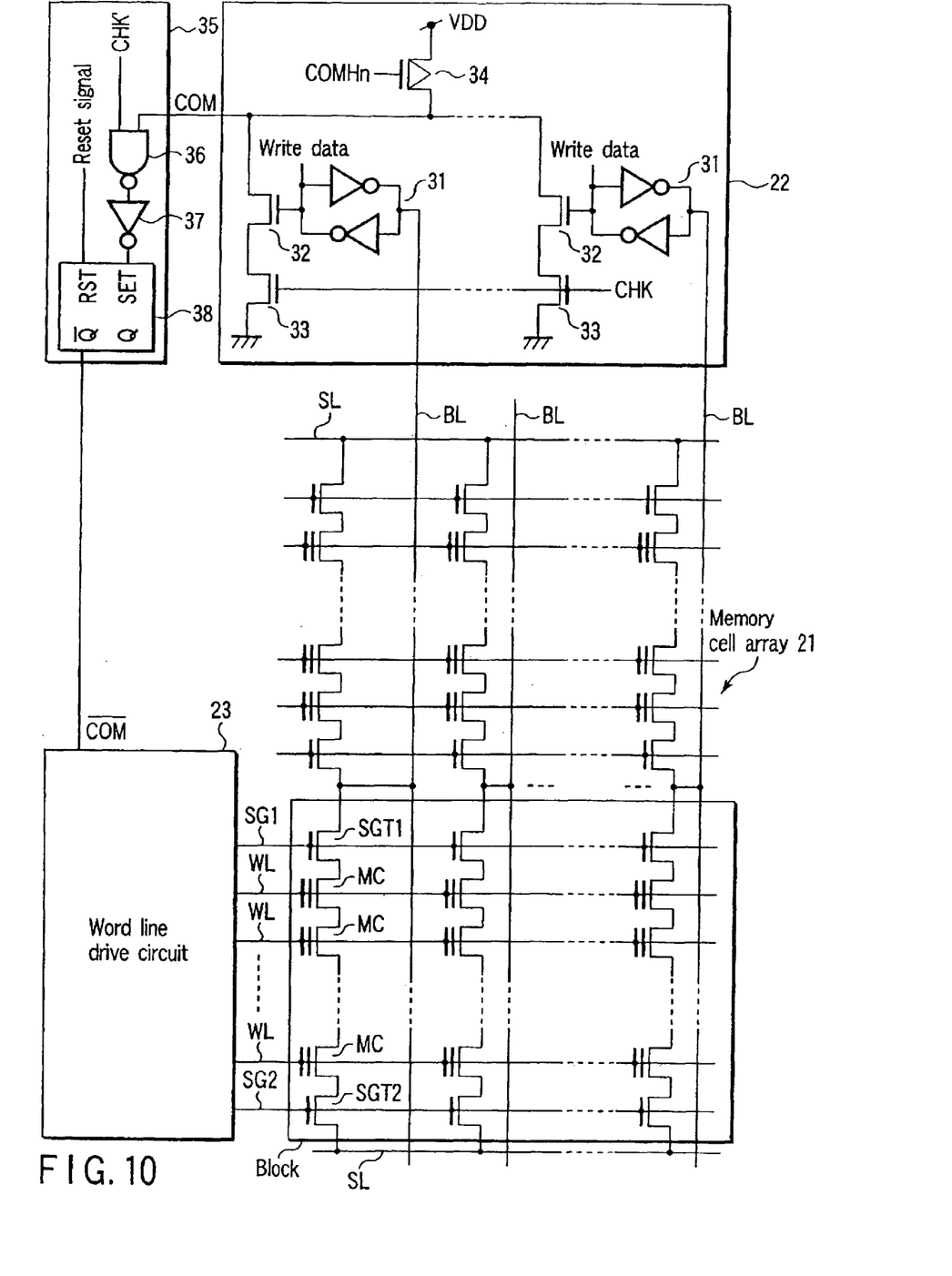
FIG. 10 is a block diagram showing the structure of the main portions of a NAND flash memory according to a third embodiment of the present invention.

However, in NAND memory, as shown in FIG. 10, a plurality of NAND cells, are connected to each of the bit lines BL. In addition, the NAND cells are divided into blocks of a plurality of NAND cells having common word lines WL, and select gate lines SG1 and SG2, and the one block is selected in each memory cell array 21 and data writing is carried out.

Figure 11:
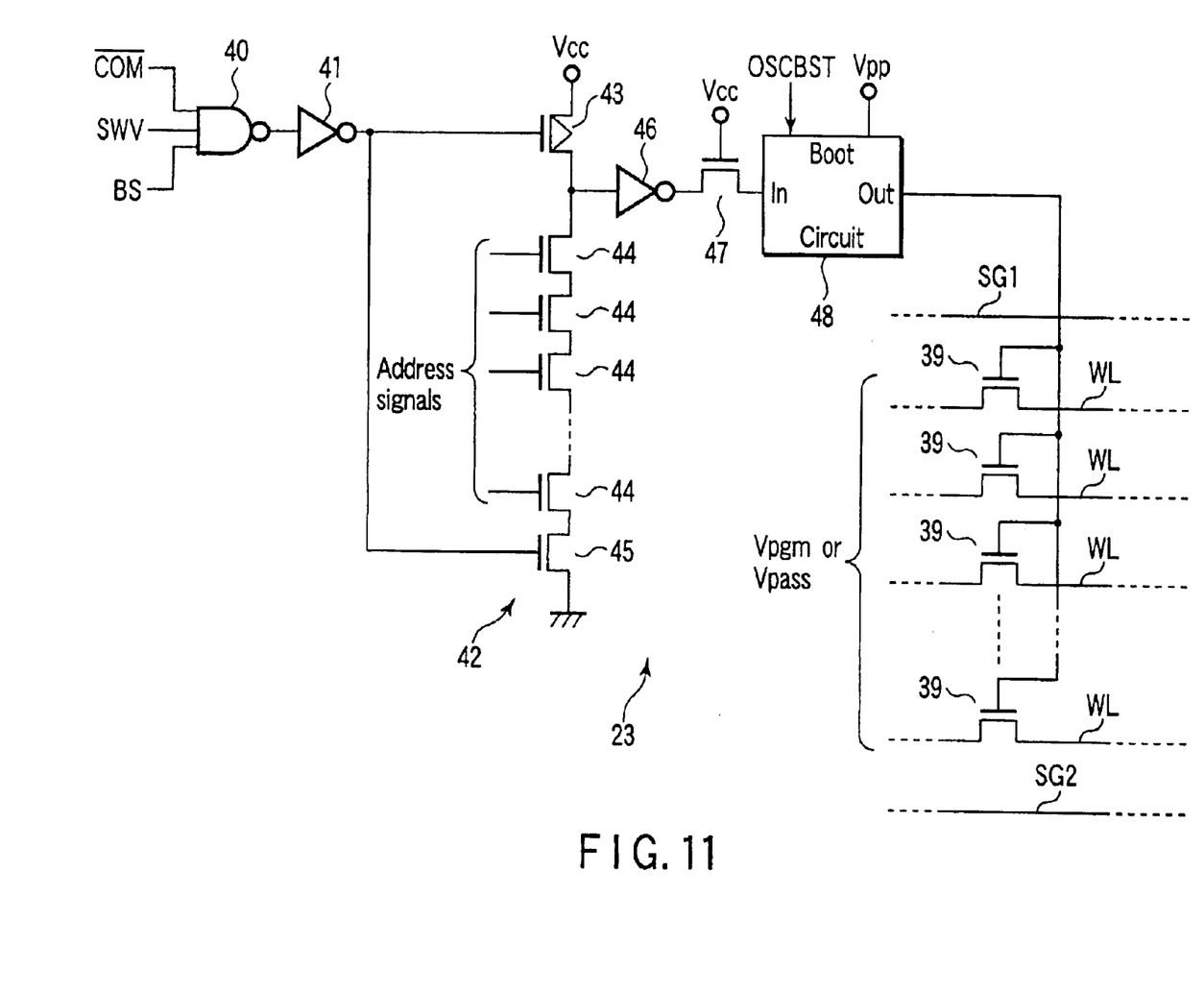
FIG. 11 is a circuit diagram sowing the detailed structure of a word line drive circuit in the NAND flash memory of FIG. 10.

In this case where a plurality of blocks are provided in the memory cell array 21, as shown in the word line drive circuit 23 of FIG. 11, for the NAND circuit 40, in addition to the signal/COM and the voltage control signal SWV described above, a block select signal BS is input. As a result, a block is selected in accordance with the block select signal BS, and the high voltage Vpgm or Vpass is output to the word lines WL in the selected block. It is to be noted that the boot circuit 48 in FIG. 11 is the same circuit structure as that shown in FIG. 7.

In addition, as described above, in the flash memory in which each of a plurality of NAND cells is connected to each of the bit lines BL, as in the second embodiment, for memory cell arrays in which all the write data for the memory cells are "1", the writing operation is not caused to start. That is to say, as shown in the flowchart in FIG. 9, after the write data are input, a determination is made as to whether or not all the write data which were latched at the latch circuits 31 are "1". For the memory cell arrays in which all of the write data for the memory cell are "1", the high voltage Vpgm or Vpass is not output to the word lines of the corresponding memory cell arrays from the time when the write operation starts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data writing method used for a semiconductor memory device in which a collective data writing operation is performed using a plurality of memory cell arrays, said data writing method comprising:
    latching data at each of a plurality of latch circuits connected to a plurality of bit lines provided on the plurality of memory cell arrays, respectively;
    executing a first data writing operation in parallel for the plurality of memory cells connected to each corresponding single word line, for each of the plurality of memory cell arrays with respect to which the collective data writing operation is performed;
    verifying the data written in the first data wiring operation, and stopping a data writing operation with respect to a first memory cell array in which writing is completed in all of the memory cells of the plurality of memory cell arrays, at a first time;
    executing a second data writing operation for a second memory cell array which is different from the first memory cell array of the plurality of memory cell arrays; and
    verifying the data written by the second data writing operation, and stopping the second data writing operation with respect to the second memory cell array in which writing is completed in all of the memory cells of the plurality of memory cell arrays, at a second time later than the first time.

2. The data writing method according to claim 1, wherein said stopping the data writing operations at the first and second time is executed by not applying a write voltage to each corresponding word line.

3. The data writing method according to clam 1, wherein each of the plurality of memory cells includes a non-volatile transistor having a control gate and a floating gate.

4. The data writing method according to claim 1, wherein each of the plurality of memory cell arrays includes a NAND cell in which adjacent memory cells share a common source/drain region.

5. The data writing method according to claim 4, wherein the NAND cell has two ends, each of which has a selective transistor connected.

6. A data writing method used for a semiconductor memory device in which a collective data writing operation is performed using a plurality of memory cell arrays, said data writing method comprising:

latching data at each of a plurality of latch circuits connected to a plurality of bit lines provided on the plurality of memory cells, respectively;

verifying the latched data, and when all of the latched data at corresponding latch circuits connected to a first memory cell array of the plurality of memory cell arrays with respect to which the collective data writing operation is performed are data unnecessary to be written, not executing a writing operation for the first memory cell array;

when the latched data at corresponding latch circuits connected to a memory cell array different from the first memory cell array of the plurality of the memory cell arrays with respect to which the collective data writing operation is performed include data necessary to be written, executing a first data writing operation for the memory cell array different from the first memory cell array.

7. The data writing method according to claim 6, wherein each of the plurality of memory cell arrays includes a NAND cell in which adjacent memory cells share a common source/drain region.

8. The data writing method according to claim 7, wherein the NAND cell has two ends, each of which has a selective transistor connected.

9. The data writing method according to claim 6, further comprising:

verifying data written in the first data writing operation, and stopping writing to a second memory cell array in which writing in all of the memory cell arrays is completed, at a first time, executing a second data writing operation for a third memory cell array different from the first and second memory cell arrays of the plurality of memory cell arrays; and verifying data written in the second data writing operation, and stopping writing for the third memory cell array in which writing in all of the memory cell arrays is completed, at a second time later than the first time.

10. The data writing method according to claim 9, wherein said stopping the data writing operations at the first and second time is executed by not applying a write voltage to the word line.

* * * * *